(12) United States Patent
Tong et al.

(10) Patent No.: US 12,713,698 B2
(45) Date of Patent: Aug. 18, 2026

(54) PIXEL UNIT STRUCTURE AND PREPARATION METHOD THEREOF, DISPLAY PANEL AND PREPARATION METHOD THEREOF

(71) Applicant: BOE Technology Group Co., Ltd., Beijing (CN)

(72) Inventors: Binbin Tong, Beijing (CN); Ce Ning, Beijing (CN); Lizhong Wang, Beijing (CN); Rui Huang, Beijing (CN); Wei Yang, Beijing (CN); Meng Zhao, Beijing (CN); Tianmin Zhou, Beijing (CN); Jinchao Zhang, Beijing (CN); Hui Guo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 439 days.

(21) Appl. No.: 18/280,682

(22) PCT Filed: Nov. 30, 2022

(86) PCT No.: PCT/CN2022/135494
§ 371 (c)(1),
(2) Date: Sep. 7, 2023

(87) PCT Pub. No.: WO2024/113236
PCT Pub. Date: Jun. 6, 2024

(65) Prior Publication Data
US 2024/0304633 A1 Sep. 12, 2024

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0221* (2025.01); *H10D 86/441* (2025.01); *H10D 86/451* (2025.01); *H10D 86/423* (2025.01)

(58) Field of Classification Search
CPC .... H10D 86/60; H10D 86/0221; H10D 86/01; H10D 86/441; H10D 86/40;
(Continued)

(56) References Cited

U.S. PATENT DOCUMENTS 10,811,437 B2 * 10/2020 Lee .................. G02F 1/136286
11,333,935 B2 * 5/2022 Nakagawa ........ G02F 1/134309
(Continued)

*Primary Examiner* — Nikolay K Yushin

(57) ABSTRACT

The present invention provides a pixel unit structure, in which a source electrode is connected to a data line in a thin film transistor; the gate electrode is connected to the gate line; the drain electrode is disposed on a side of the gate insulating layer away from the substrate; the metal oxide semiconductor layer is disposed on a side of the gate insulating layer away from the substrate, and includes a semiconductor portion and a first conductive portion and a second conductive portion respectively located on both sides of the semiconductor portion; a terminal of the first conductive portion adjacent to the drain electrode is connected to the drain electrode or serves as at least a portion of the drain electrode; and the second conductive portion is connected to the source electrode through a first via formed correspondingly on the gate insulating layer and the interlayer dielectric layer.

19 Claims, 15 Drawing Sheets

(51) Int. Cl.
*H10D 86/40* (2025.01)
*H10D 86/60* (2025.01)

(58) Field of Classification Search
CPC .... H10D 86/451; H10D 86/423; H10D 86/00; H10D 30/67; H10D 30/6729; H10D 30/6755; H10D 30/6757; H10D 62/10; H10D 62/80; H10D 62/40; H10D 62/299; H10D 30/6708; H10D 30/6715; G02F 1/133; G02F 1/1368; G02F 1/1343; G02F 1/167; G09G 3/36; G09G 3/3235; G09G 3/3266; G09G 3/3233; G09G 3/3225
See application file for complete search history.

(56) References Cited

U.S. PATENT DOCUMENTS

2019/0296048 A1* 9/2019 Lee .................. G02F 1/136286
2020/0271997 A1* 8/2020 Nakagawa ........ G02F 1/134309

* cited by examiner

PIXEL UNIT STRUCTURE AND PREPARATION METHOD THEREOF, DISPLAY PANEL AND PREPARATION METHOD THEREOF

CROSS-REFERENCE TO RELATED APPLICATIONS

The present application is a U.S. National Phase Entry of International Application PCT/CN2022/135494 having an international filing date of Nov. 30, 2022, and the contents disclosed in the above-mentioned application are hereby incorporated as a part of this application.

TECHNICAL FIELD

The invention relates to the technical field of display, in particular to a pixel unit structure and a preparation method thereof, a display panel and a preparation method thereof.

BACKGROUND

Virtual Reality (VR) is a new technology that integrates real world information and virtual world information seamlessly. VR head display is a near-eye display device. Compared with conventional display devices, it needs high resolution to eliminate screen window effect. LCD (Liquid Crystal Display) is easier to achieve high resolution than OLED (Organic Light-Emitting Diode), so LCD technology is the mainstream technology of VR display products at present.

LCD display needs to consider backlight power consumption, which is directly related to pixel aperture ratio. Pixel aperture ratio refers to the ratio of the area of the light passing portion after removing the wiring portion and thin film transistor of each sub-pixel to the area of each sub-pixel as a whole. The higher the pixel aperture ratio is, the higher the efficiency of light passing is. However, the higher the resolution of LCD display, there are more metal wires, and the smaller the pixel aperture ratio.

Therefore, how to improve the pixel aperture ratio under the condition of the same LCD display resolution is an urgent problem to be solved at present.

SUMMARY

The present invention aims at solving at least one of the technical problems existing in the prior art, and provides a pixel unit structure and a preparation method thereof, a display panel and a preparation method thereof, which can not only improve the aperture ratio of the pixel, but also increase the channel length under the same space size, thereby improving the stability of the thin film transistor.

To achieve the above object, an embodiment of the present disclosure provides a pixel unit structure including a gate line, a data line and a thin film transistor, wherein the gate line and the data line intersect and define a pixel region; the thin film transistor includes a source electrode, an interlayer dielectric layer, a gate electrode, a gate insulating layer, a drain electrode and a metal oxide semiconductor layer formed on a substrate, wherein the source electrode, the interlayer dielectric layer, the gate electrode and the gate insulating layer are sequentially disposed in a direction away from the substrate; the source electrode is connected to the data line; the gate electrode is connected to the gate line; the drain electrode is disposed on a side of the gate insulating layer away from the substrate;

the metal oxide semiconductor layer is disposed on a side of the gate insulating layer away from the substrate, and includes a semiconductor portion and a first conductive portion and a second conductive portion respectively located on both sides of the semiconductor portion, wherein the semiconductor portion covers a protrusion of the gate insulating layer, and the protrusion is a portion where the gate insulating layer covers the gate electrode; a terminal of the first conductive portion adjacent to the drain electrode is connected to the drain electrode or serves as at least a portion of the drain electrode; and the second conductive portion is connected to the source electrode through a first via formed correspondingly on the gate insulating layer and the interlayer dielectric layer.

Optionally, the gate electrode includes a first outer surface adjacent to the interlayer dielectric layer and a second outer surface adjacent to the gate insulating layer; and a cross section length of the second outer surface in a direction perpendicular to the extension direction of the gate electrode satisfies that an equivalent channel length is greater than or equal to a preset length.

Optionally, the equivalent channel length is greater than or equal to 3 microns.

Optionally, the shape of the second outer surface in a cross section of the gate perpendicular to its extension direction includes a polygon or a circular arc.

Optionally, the cross section shape of the gate electrode in a direction perpendicular to its extension direction includes an isosceles trapezoid;

the equivalent channel length satisfies the following relationship:

$$L = c + 2\times\left(\frac{a}{\sin\theta}\right)$$

wherein, L is the equivalent channel length; a is a length of the waist of the isosceles trapezoid; b is a length of a long side of the isosceles trapezoid; c is a length of a short side of the isosceles trapezoid; θ is a bottom angle of the isosceles trapezoid, and $$\tan\theta = \frac{a}{\left(\frac{b}{2} - \frac{c}{2}\right)}.$$

Optionally, the first conductive portion is disposed in a same layer as the drain electrode, and a terminal of the first conductive portion adjacent to the drain electrode is superposed on a side of the drain electrode away from the substrate.

Optionally, the thin film transistor further includes a passivation layer, a planarization layer and a pixel electrode, wherein the passivation layer is disposed on a side of the interlayer dielectric layer away from the substrate and covering the metal oxide semiconductor layer; the planarization layer is disposed on a side of the passivation layer away from the substrate; the pixel electrode is disposed on a side of the planarization layer away from the substrate, and is connected to the drain electrode through a second via correspondingly formed on the planarization layer and the passivation layer.

Optionally, the thin film transistor further includes a passivation layer disposed on a side of the interlayer dielectric layer away from the substrate and covering the metal oxide semiconductor layer;

the drain electrode is disposed on a side of the passivation layer away from the substrate, and is connected to the first conductive portion through a third via formed on the passivation layer.

Optionally, the thin film transistor further includes a planarization layer and a pixel electrode, wherein the planarization layer is disposed on a side of the passivation layer away from the substrate; the pixel electrode is disposed on a side of the planarization layer away from the substrate, and is connected to the drain electrode through a second via formed on the planarization layer.

Optionally, a terminal of the first conductive portion adjacent to the drain electrode is used as at least a portion of the drain electrode;

the thin film transistor further includes a passivation layer, a planarization layer and a pixel electrode, wherein the passivation layer is disposed on a side of the interlayer dielectric layer away from the substrate and covering the metal oxide semiconductor layer; the planarization layer is disposed on a side of the passivation layer away from the substrate; the pixel electrode is disposed on a side of the planarization layer away from the substrate, and is connected to the first conductive portion through a second via correspondingly formed on the planarization layer and the passivation layer.

Optionally, an orthographic projection of the second via on a plane parallel to the substrate overlaps an orthographic projection of the gate on a plane parallel to the substrate.

Optionally, the interlayer dielectric layer includes silicon dioxide; and a thickness of the interlayer dielectric layer is greater than or equal to 5000 Å.

Optionally, the passivation layer includes a first passivation layer and a second passivation layer disposed in sequence in a direction away from the substrate, and the first passivation portion includes silicon dioxide; and the second passivation portion includes silicon nitride or silicon oxynitride.

As another technical proposal, the present invention further provides a display panel, which includes the pixel unit structure according to the present invention.

As another technical proposal, the present invention further provides a method for preparing a pixel unit structure, including:

forming a data line and a source electrode on a substrate, wherein the source electrode is connected to the data line;

forming an interlayer dielectric layer on the substrate on which the source electrode is formed;

forming a gate line and a gate electrode on the substrate on which the interlayer dielectric layer is formed, wherein the gate electrode is connected to the gate line;

forming a gate insulating layer on the substrate on which the gate electrode is formed;

forming a drain electrode on the substrate on which the gate insulating layer is formed;

correspondingly forming a first via on the gate insulating layer and the interlayer dielectric layer;

forming a metal oxide semiconductor layer on the substrate on which the drain electrode is formed; the metal oxide semiconductor layer is disposed on a side of the gate insulating layer away from the substrate, and includes a semiconductor portion and a first conductive portion and a second conductive portion respectively located on both sides of the semiconductor portion, wherein the semiconductor portion covers a protrusion of the gate insulating layer, and the protrusion is a portion where the gate insulating layer covers the gate electrode; a terminal of the first conductive portion adjacent to the drain electrode is connected to the drain electrode or serves as at least a portion of the drain electrode; and the second conductive portion is connected to the source electrode through the first via.

Optionally, the first conductive portion is disposed in a same layer as the drain electrode, and a terminal of the first conductive portion adjacent to the drain electrode is superposed on a side of the drain electrode away from the substrate;

after the metal oxide semiconductor layer is formed on the substrate on which the drain electrode is formed, the method further includes:

forming a passivation layer on the substrate on which the metal oxide semiconductor layer is formed; the passivation layer is disposed on a side of the interlayer dielectric layer away from the substrate and covering the metal oxide semiconductor layer;

forming a planarization layer on the substrate on which the passivation layer is formed;

correspondingly forming a second via on the planarization layer and the passivation layer;

forming a pixel electrode on the substrate on which the planarization layer is formed; the pixel electrode is disposed on a side of the planarization layer away from the substrate, and is connected to the drain electrode through the second via.

Optionally, after the metal oxide semiconductor layer is formed on the substrate on which the drain electrode is formed, the method further includes:

forming a passivation layer on the substrate on which the metal oxide semiconductor layer is formed; the passivation layer is disposed on a side of the interlayer dielectric layer away from the substrate and covering the metal oxide semiconductor layer;

forming a third via on the passivation layer;

forming a drain electrode on the substrate on which the passivation layer is formed, wherein the drain electrode is disposed on a side of the passivation layer away from the substrate and is connected to the first conductive portion through the third via.

Optionally, after the drain electrode is formed on the substrate on which the passivation layer is formed, the method further includes:

forming a planarization layer on the substrate on which the drain electrode is formed; the planarization layer is disposed on a side of the passivation layer away from the substrate; forming a second via on the planarization layer;

forming a pixel electrode on the substrate on which the planarization layer is formed; the pixel electrode is disposed on a side of the planarization layer away from the substrate, and is connected to the drain electrode through the second via.

Optionally, a terminal of the first conductive portion adjacent to the drain electrode is used as at least a portion of the drain electrode;

after the metal oxide semiconductor layer is formed on the substrate on which the drain electrode is formed, the method further includes:

forming a passivation layer on the substrate on which the metal oxide semiconductor layer is formed; the passivation layer is disposed on a side of the interlayer dielectric layer away from the substrate and covering the metal oxide semiconductor layer;

forming a planarization layer on the substrate on which the passivation layer is formed;

correspondingly forming a second via on the planarization layer and the passivation layer;

forming a pixel electrode on the substrate on which the planarization layer is formed; the pixel electrode is disposed on a side of the planarization layer away from the substrate, and is connected to the drain electrode through the second via.

Optionally, an orthographic projection of the second via on a plane parallel to the substrate overlaps an orthographic projection of the gate electrode on a plane parallel to the substrate.

As another technical proposal, the present invention further provides a display panel, which includes the method for preparing a pixel unit structure according to the present invention.

DETAILED DESCRIPTION

Figure 1:
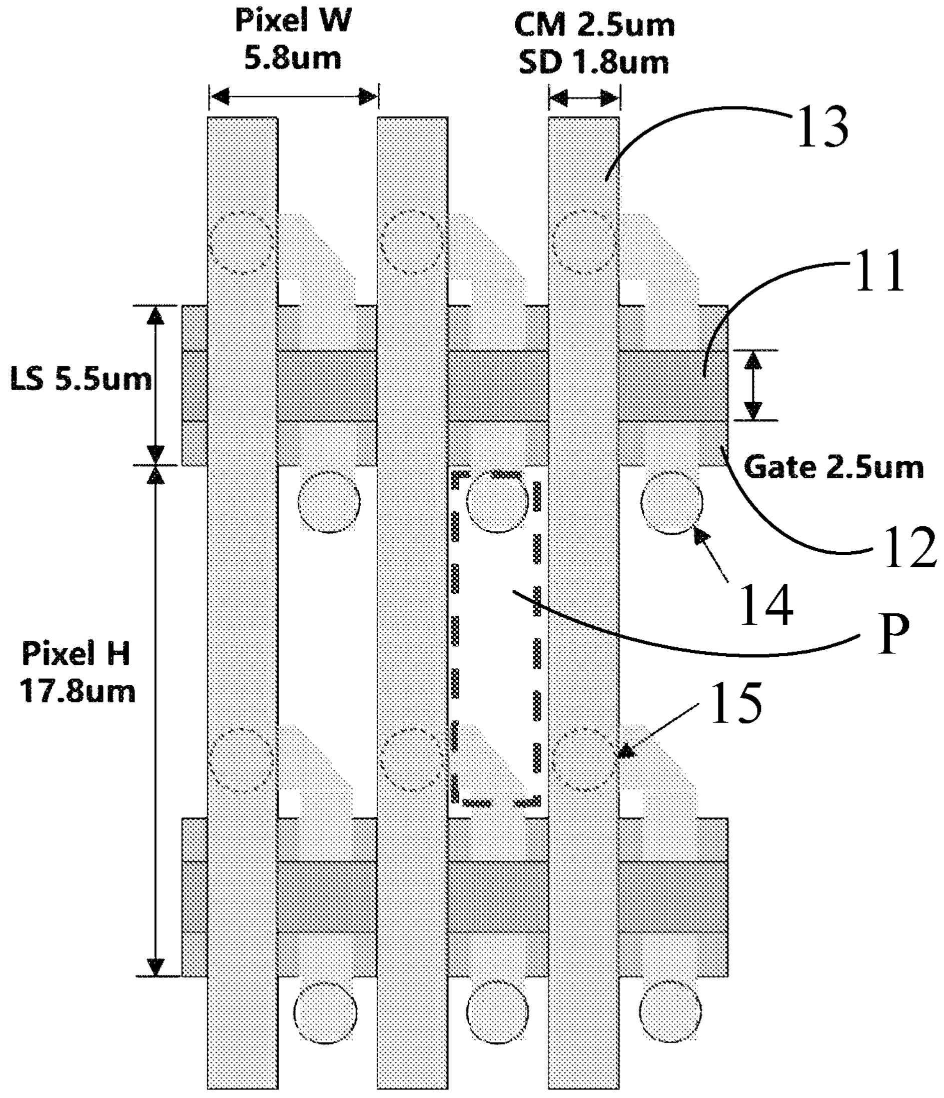
FIG. 1 is a plan view of a pixel unit structure in the prior art.

In order to make the object, technical aspect and advantages of the present invention clearer, the present invention will be described in further detail below in conjunction with the accompanying drawings, and it will be apparent that the described embodiments are only partial and not all embodiments of the present invention. Based on the embodiments of the present invention, all other embodiments obtained by a person of ordinary skill in the art without paying any inventive effort are within the scope of protection of the present invention.

The shapes and sizes of the components in the drawings do not reflect true proportions and are intended only to facilitate understanding of the contents of the embodiments of the present invention.

Unless otherwise defined, technical terms or scientific terms used in the present disclosure should have the meanings as commonly understood by those of ordinary skill in the art that the present disclosure belongs to. The “first”, “second” and similar terms used in the present disclosure do not indicate any order, quantity, or importance, but are used only for distinguishing different components. Similarly, similar words such as “a”, “an” or “the” do not denote a limitation on quantity, but rather denote the presence of at least one. “Include”, “contain”, or similar words mean that elements or objects appearing before the words cover elements or objects listed after the words and their equivalents, but do not exclude other elements or objects. “Connect”, “join”, or a similar term is not limited to a physical or mechanical connection, but may include an electrical connection, whether direct or indirect. “Upper”, “lower”, “left”, “right”, etc., are used to represent relative position relations, and when an absolute position of a described object is changed, the relative position relation may also be correspondingly changed.

Embodiments of the present disclosure are not limited to the embodiment shown in the drawings, but include modifications of configurations for based on manufacturing processes. Therefore, the regions illustrated in the drawings have schematic properties, and the shapes of the regions shown in the drawings illustrate the specific shapes of the regions of the elements, but are not intended to be limiting.

Through research, the inventor found that a pixel unit structure in the prior art is shown in FIG. 1, and light shielding strips (LS) 12 are disposed on both sides of the gate line (Gate) 11 to avoid light leakage. A common electrode (CM) 13 is provided overlapped with a data line (SD), the data line (SD) is shielded by the common electrode 13 and not shown in FIG. 1, and the width of the common electrode 13 is greater than the width of the data line for reducing cross-color. Due to the above arrangement of the light shielding strip 12, the aperture ratio of the pixel opening region P defined by the intersection of the gate line 11 and the data line is low, and specifically, as shown in FIG. 1, the width (Pixel W) of the pixel unit is 5.8 microns. The height of the pixel unit (Pixel H) is 17.8 microns, and the pixel aperture ratio of the pixel unit structure in FIG. 1 is only 39%. In addition, both the data line and the gate line 11 are located on a side of the metal oxide semiconductor layer away from the substrate, and the connections between the metal oxide semiconductor layer and the source electrode and the drain electrode need to be achieved through double vias (14, 15). Since one via 14 is located in the pixel opening region P, the pixel opening region P is limited by the size of the via 14 (the diameter of the via 14 is, for example, 2.1 microns) and cannot be continuously reduced, thus limiting the improvement of the display resolution.

Figure 2:
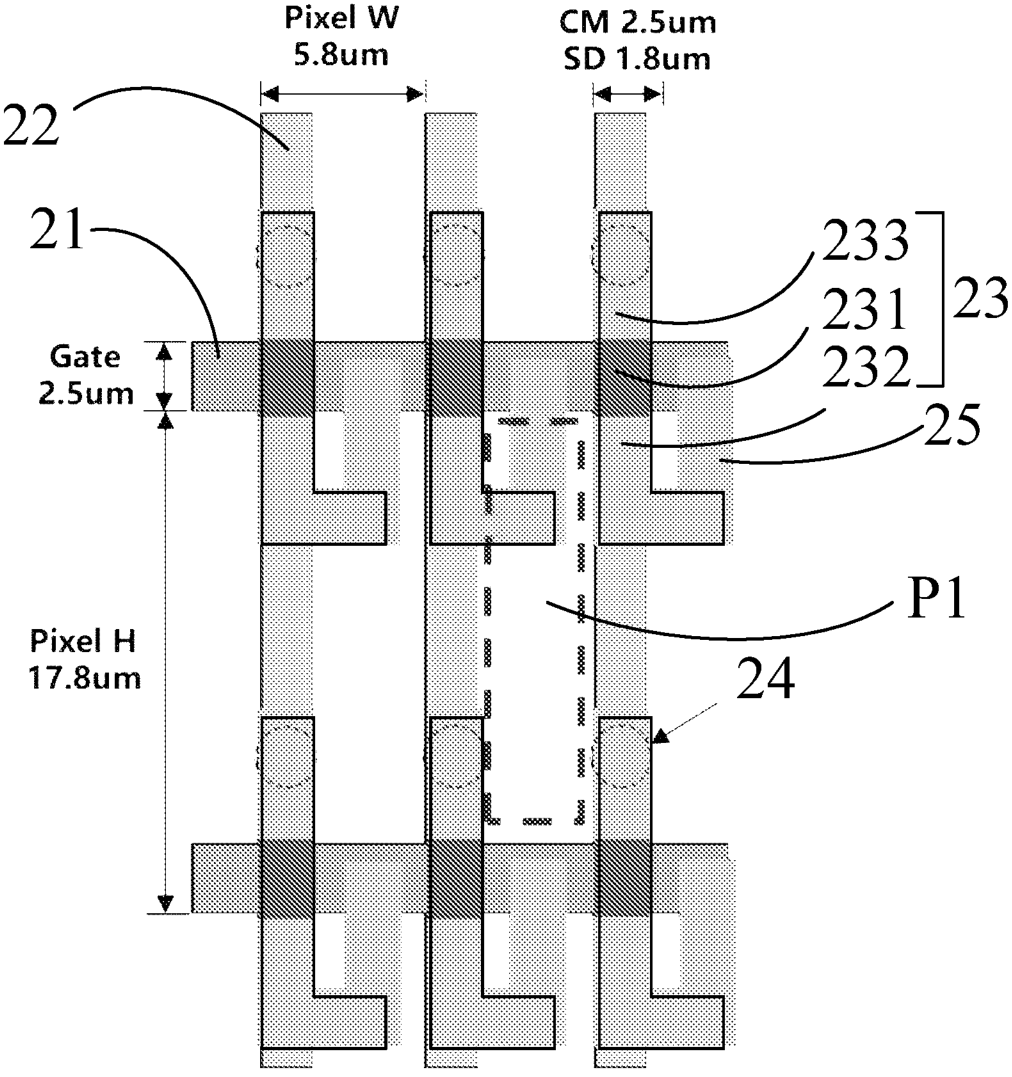
FIG. 2 is a plan view of the pixel unit structure according to an embodiment of the present invention.

To solve at least one of the above problems, referring to FIG. 2, an embodiment of the present invention provides a pixel unit structure including a gate line (Gate) 21, a data line (SD) 22 and a thin film transistor, the gate line 21 and the data line 22 intersect and define a pixel region; wherein the thin film transistor includes a source electrode (Source), an interlayer dielectric layer (ILD), a gate electrode, a gate insulating layer (GI), a drain electrode (Drain) 25, and a metal oxide semiconductor layer (IGZO) 23 formed on a substrate, wherein the source electrode (Source), the interlayer dielectric layer (ILD), the gate electrode, and the gate insulating layer (GI) are sequentially disposed in a direction away from the substrate; the source electrode (Source) is connected to a data line (SD) 22; and the gate electrode is connected to a gate line (Gate) 21. Optionally, the source electrode (Source) is a portion of the data line (SD) 22 (i.e., a portion overlapping the second conductive portion 233 of the metal oxide semiconductor layer (IGZO) 23); the gate electrode is a portion of the gate line (Gate) 21 (i.e. a portion overlapping the semiconductor portion 231 of the metal oxide semiconductor layer (IGZO) 23). The drain electrode (Drain) 25 is disposed on a side of the gate insulating layer away from the substrate. FIG. 2 shows only a portion of the film layers such as a gate line (Gate) 21, a data line (SD) 22, a drain electrode (Drain) 25, and a metal oxide semiconductor layer (IGZO) 23, and does not show a substrate, an interlayer dielectric layer (ILD), a Gate insulating layer (GI), or the like.

Figure 3A:
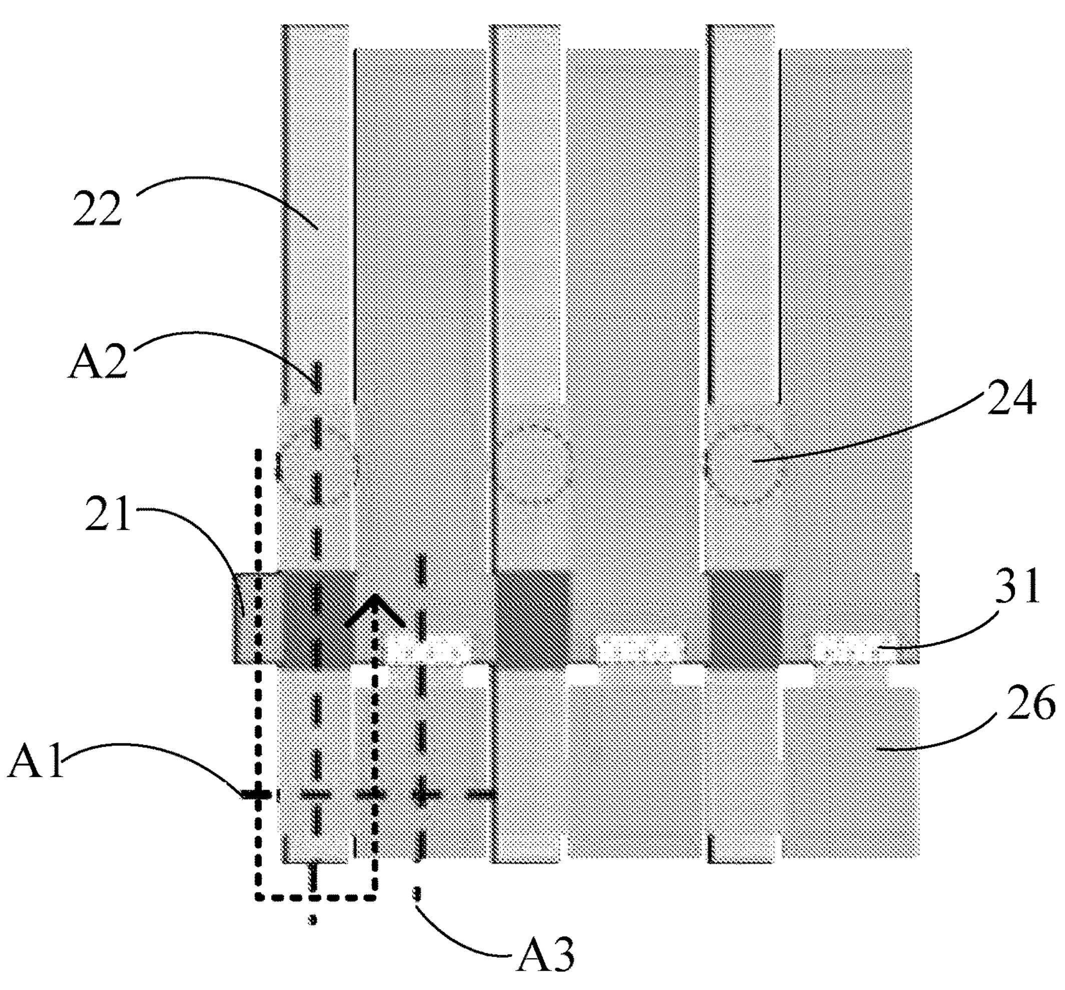
FIG. 3A is a first plan view of the pixel unit structure according to an embodiment of the present invention.
Figure 3B:
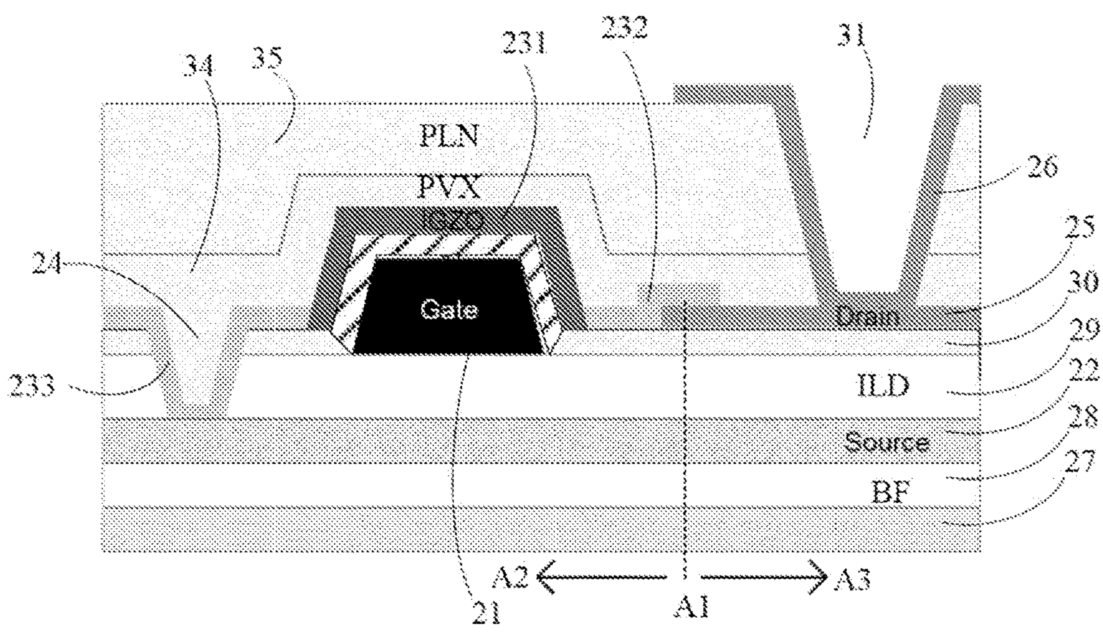
FIG. 3B is a sectional view taken along the dashed line A1-A3 in FIG. 3A.

FIG. 3B is a view of two sections cut along the dashed lines A2 and A3 in FIG. 3A and developed from the dashed line A1 to both sides thereof into one section. The direction from left to right in FIG. 3B is the direction of the dashed arrow in FIG. 3A. Referring also to FIGS. 2, 3A, and 3B, a metal oxide semiconductor layer 23 is disposed on a side of the gate insulating layer 30 away from the substrate 27, and includes a semiconductor portion 231 and a first conductive portion 232 and a second conductive portion 233 respectively located on both sides of the semiconductor portion, wherein the semiconductor portion 231 covers a protrusion of the gate insulating layer 30 (i.e., a shaded portion of the gate insulating layer 30 in FIG. 3B), and the protrusion is the portion where the gate insulating layer 30 covers the gate electrode (a portion of the gate line 21); a terminal of the first conductive portion 232 adjacent to the drain electrode 25 is connected to the drain electrode 25 or serves as at least a portion of the drain electrode 25; and the second conductive portion 233 is connected to a source electrode (a portion of the data line 22) through a first via 24 formed correspondingly on the gate insulating layer 30 and the interlayer dielectric layer 29.

Taking the LCD display panel as an example, when light emitted by the backlight module is incident from the substrate away from the film layer, by making the semiconductor portion 231 of the metal oxide semiconductor layer 23 cover the portion of the gate insulating layer 30 covering the gate electrode (i.e., the protrusion described above), and having the gate line (containing the gate electrode) 21 disposed on a side of the semiconductor portion 231 close to the substrate 27, the gate line 21 may serve as a light shield, thereby replacing the light shielding strip in the prior art. Therefore, the pixel unit structure according to an embodiment of the present invention can increase the aperture ratio of the pixel opening region defined by the intersection of the gate line 21 and the data line 22 without using the light shielding strip. Specifically, as shown in FIG. 2, since the light shielding strip is omitted, with the same size and resolution of the film layer, the length of the pixel opening region P1 in a direction parallel to the data line 22 is increased by the sum of the widths of the two light shielding strips relative to the prior art. For example, the width of the pixel unit (Pixel W) is 5.8 microns; the height (Pixel H) of the pixel unit is 17.8 microns, which makes it possible to make the aperture ratio reach 49% when the common electrode (CM) is provided and reach 59% when the common electrode (CM) is not provided.

In addition, as shown in FIG. 3B, by making the semiconductor portion 231 of the metal oxide semiconductor layer 23 cover the portion of the gate insulating layer 30 covering the gate electrode (i.e., the protrusion described above), the semiconductor portion 231 faces not only the top surface of the gate electrode, but also both side surfaces of the gate electrode, i.e. a side channel is added on the basis of forming the lateral channel, so that the channel length can be increased under the same spatial size, and thus the stability of the thin film transistor can be improved.

In some alternative embodiments, as shown in FIG. 3B, the gate line 21 (including the gate electrode) includes a first outer surface close to the interlayer dielectric layer 29 and a second outer surface close to the gate insulating layer 30; a cross section length of the second outer surface in a direction perpendicular to the extension direction of the gate line 21 (including the gate electrode) satisfies that the equivalent channel length (i.e. the actual channel length) is greater than or equal to a preset length. That is to say, by designing the cross section length of the second outer surface in the direction perpendicular to the extension direction of the gate electrode, the equivalent channel length can be long enough to reach the required preset length, thus improving the stability of the thin film transistor. Optionally, the equivalent channel length is greater than or equal to 3 microns.

In some alternative embodiments, the shape of the second outer surface in a cross section in the direction perpendicular to the extension direction of the gate electrode includes a polygon or a circular arc. The polygon includes, for example, isosceles trapezoids, rectangles, and the like. In practical applications, the shape of the second outer surface in a cross section in the direction perpendicular to the extension direction of the gate electrode can be designed according to the specific shape, and the embodiments of the present invention are not particularly limited in this regard.

Figure 4:
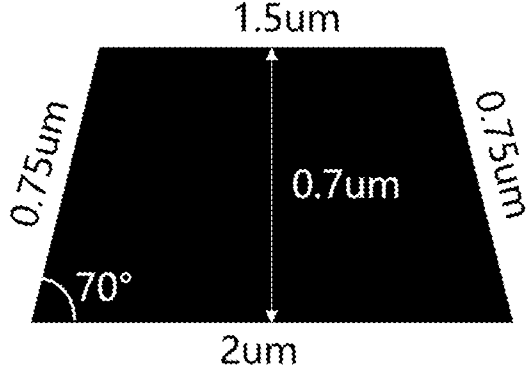
FIG. 4 is a sectional view of a gate line adopted in an embodiment of the present invention.

In some alternative embodiments, as shown in FIG. 4, the cross section shape of the gate electrode in a direction perpendicular to its extension direction includes an isosceles trapezoid; in this case, the above equivalent channel length satisfies the following relationship:

$$L = c + 2\times\left(\frac{a}{\sin\theta}\right)$$

wherein, L is the equivalent channel length; a is a length of the waist of the isosceles trapezoid; b is a length of a long side of the isosceles trapezoid; c is a length of a short side of the isosceles trapezoid; θ is a bottom angle of the isosceles trapezoid, and $$\tan\theta = \frac{a}{\left(\frac{b}{2} - \frac{c}{2}\right)}.$$

In a specific embodiment, a=0. 75 μm; b=2 μm; c=1.5 μm; θ=70°; Height of isosceles trapezoid=0.7 μm. Therefore, the equivalent channel length L can be calculated to be 3.0 μm according to the above relationship. In practical application, the above dimensions can be set according to the specific process requirements, as long as the equivalent channel length L which is long enough can be obtained.

In some alternative embodiments, the gate line 21 (including the gate electrode) includes three metal layers, for example, Ti, Al, Ti, and the thicknesses of the three metal layers are, for example, 500 Å, 6000 Å, and 500 Å, respectively.

In some alternative embodiments, the gate insulating layer 30 includes silicon dioxide (SiO2) with a thickness of 1400 Å.

The first conductive portion 232 and the drain electrode 25 may be connected in a variety of ways, for example, referring to FIGS. 3A and 3B together. In the first connection way, the first conductive portion 232 is disposed in a same layer as the drain electrode 25, and a terminal of the first conductive portion 232 adjacent to the drain electrode 25 is superposed on a side of the drain electrode 25 away from the substrate 27, that is, the first conductive portion 232 is directly overlapped with the drain electrode 25. This eliminates the need to provide a via for connecting the first conductive portion 232 to the drain electrode 25 in comparison with the prior art, so that the display resolution can be improved by reducing the pixel opening without being limited by the size of the via located in the pixel opening region.

On the basis of using the first connection mode, in some alternative embodiments, referring to FIGS. 3A and 3B together, the thin film transistor further includes a passivation layer (PVX) 34, a planarization layer (PLN) 35, and a pixel electrode 26, wherein the passivation layer 34 is disposed on a side of the interlayer dielectric layer 29 away from the substrate 27 and covers the metal oxide semiconductor layer; a planarization layer 35 is disposed on a side of the passivation layer 34 away from the substrate 27. The pixel electrode 26 is disposed on a side of the planarization layer 35 away from the substrate 27 and is connected to the drain electrode 25 through a second via 31 formed correspondingly on the planarization layer 35 and the passivation layer 34. Thus, the connection between the pixel electrode 26 and the drain electrode 25 can be achieved.

Preferably, an orthographic projection of the second via 31 on a plane parallel to the substrate 27 overlaps an orthographic projection of the gate electrode (a portion of the gate line 21) on a plane parallel to the substrate 27. In this way, the gate line 21 (including the gate electrode) can play a shielding role at the bottom of the second via 31 (i.e. a side close to the substrate 27) so that light leakage from the via can be reduced or avoided. Specifically, an orthographic projection of the second via 31 on the plane parallel to the substrate 27 and an orthographic projection of the gate electrode on the plane parallel to the substrate 27 are completely located in an orthographic projection of the gate line 21 (including the gate electrode) on the plane parallel to the substrate 27.

The second connection mode of the first conductive portion 232 and the drain electrode 25 is as follows: referring to FIGS. 5A and 5B together, the passivation layer 34 is disposed on a side of the interlayer dielectric layer 29 away from the substrate 27, and covers the metal oxide semiconductor layer. The drain electrode 25 is disposed on a side of the passivation layer 34 away from the substrate 27 and is connected to the first conductive portion 232 through a third via 36 formed on the passivation layer 34. That is to say, the first conductive portion 232 and the drain electrode 25 are disposed in different layers, and the passivation layer 34 is located between the first conductive portion 232 and the drain electrode 25. This arrangement can effectively reduce the parasitic capacitance between the first conductive portion 232 and the drain electrode 25.

Figure 5A:
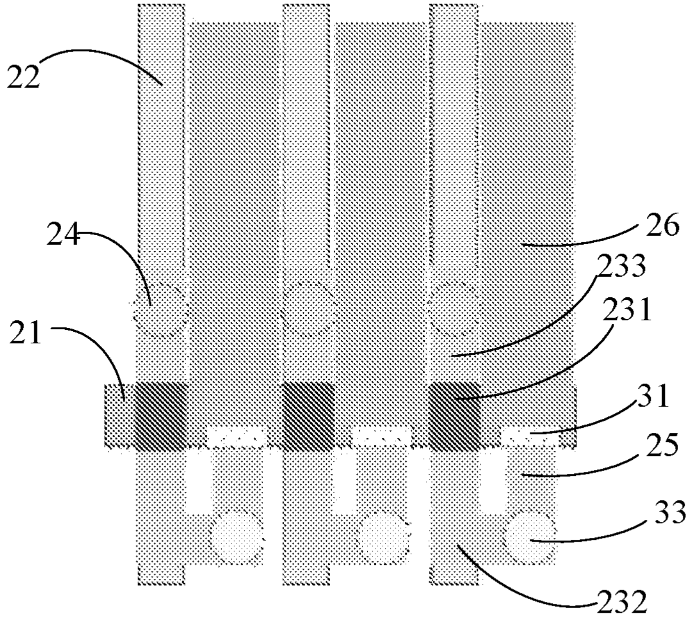
FIG. 5A is a second plan view of a pixel unit structure according to an embodiment of the present invention.
Figure 5B:
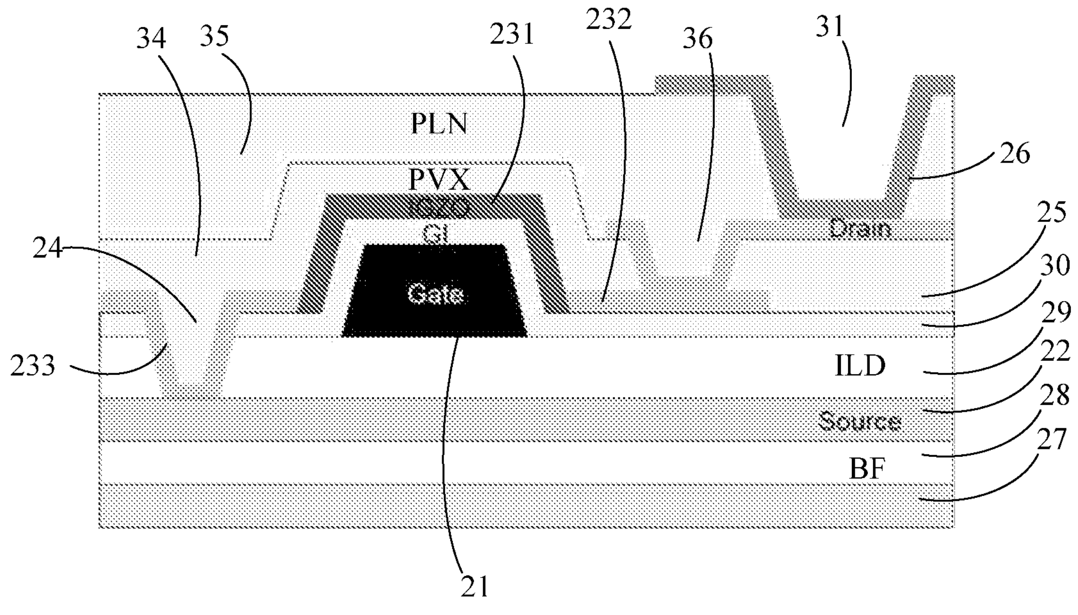
FIG. 5B is a sectional view of FIG. 5A along the same dashed line as in FIG. 3A.

On the basis of using the second connection mode, in some alternative embodiments, referring to FIGS. 5A and 5B together, the planarization layer 35 is disposed on a side of the passivation layer 34 away from the substrate 27. The pixel electrode 26 is disposed on a side of the planarization layer 35 away from the substrate 27 and is connected to the drain electrode 25 through a second via 31 formed on the planarization layer 35. Thus, the connection between the pixel electrode 26 and the drain electrode 25 can be achieved. Preferably, an orthographic projection of the second via 31 on the plane parallel to the substrate 27 overlaps an orthographic projection of the gate electrode on the plane parallel to the substrate 27. In this way, the gate line 21 (including the gate electrode) can play a shielding role at the bottom of the second via 31 (i.e. a side close to the substrate 27) so that light leakage from the via can be reduced or avoided.

Figure 6A:
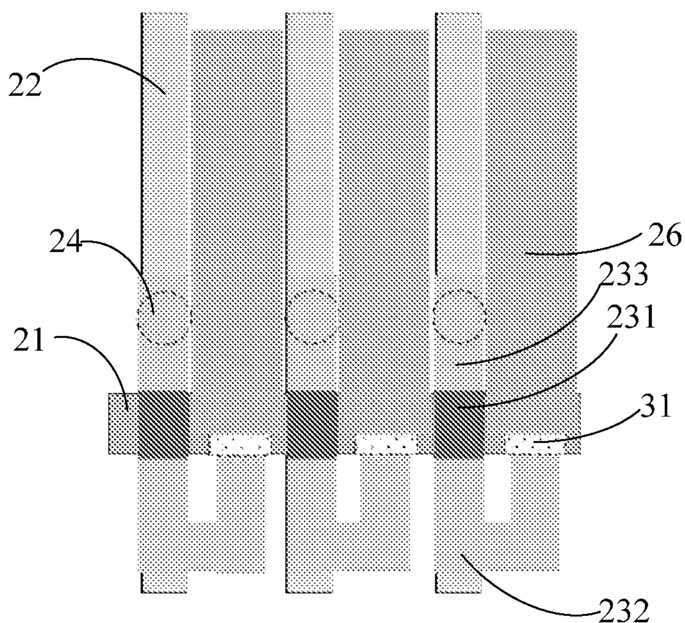
FIG. 6A is a third plan view of a pixel unit structure according to an embodiment of the present invention.
Figure 6B:
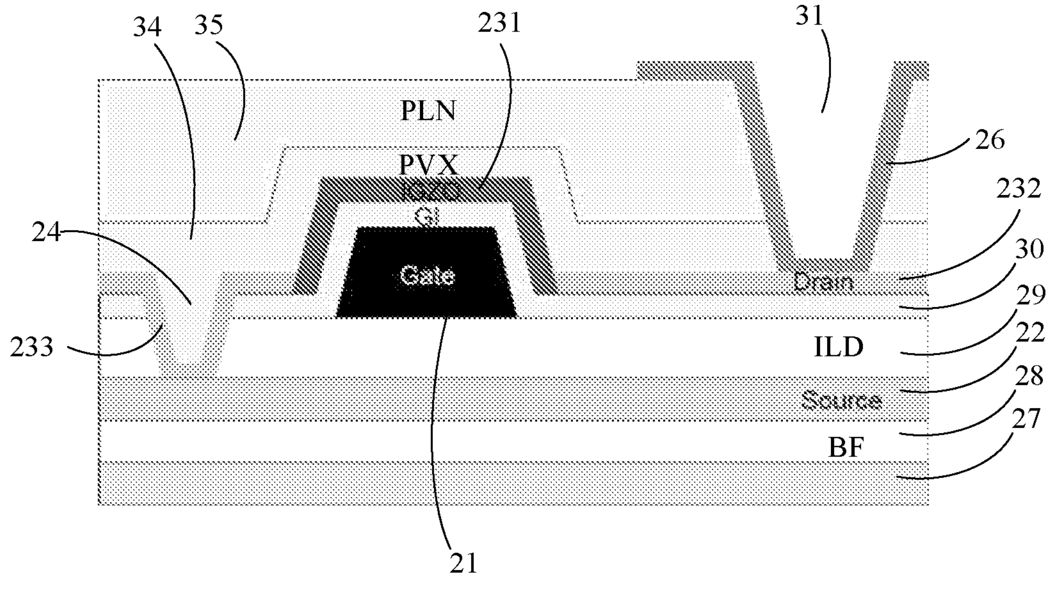
FIG. 6B is a sectional view of FIG. 5A along the same dashed line as in FIG. 3A.

A third connection mode between the first conductive portion 232 and the drain electrode 25 is that, referring to FIG. 6A and FIG. 6B together, a terminal of the first conductive portion 232 adjacent to the drain electrode 25 serves as at least a portion of the drain electrode 25, in other words, a portion of the first conductive portion 232 serves as the drain electrode 25 without additionally providing the drain electrode 25. In this way, a patterning process (i.e., Mask) can be reduced, so that not only the process can be simplified and the process efficiency can be improved, but also the pixel unit structure can be simplified and the product cost can be reduced.

On the basis of using the third connection mode, in some alternative embodiments, referring to FIGS. 6A and 6B together, the passivation layer 34 is disposed on a side of the interlayer dielectric layer 29 away from the substrate 27 and covers the metal oxide semiconductor layer 23. A planarization layer 35 is disposed on a side of the passivation layer 34 away from the substrate 27. The pixel electrode 26 is provided on a side of the planarization layer 35 away from the substrate 27 and is connected to the first conductive portion 232 through a second via 31 formed correspondingly on the planarization layer 35 and the passivation layer 34. Thus, the connection between the pixel electrode 26 and the drain electrode 25 can be achieved. Preferably, an orthographic projection of the second via 31 on the plane parallel to the substrate 27 overlaps an orthographic projection of the gate electrode on the plane parallel to the substrate 27. In this way, the gate line 21 (including the gate electrode) can play a shielding role at the bottom of the second via 31 (i.e. a side close to the substrate 27) so that light leakage from the via can be reduced or avoided.

In some alternative embodiments, the interlayer dielectric layer 29 includes silicon dioxide ($SiO2$) which facilitates ensuring semiconductor characteristics of the metal oxide semiconductor layer. Of course, in practical application, other inorganic materials may be used for the interlayer dielectric layer 29.

In some alternative embodiments, a thickness of the interlayer dielectric layer 29 is greater than or equal to 5000 Å. By setting the thickness of the interlayer dielectric layer 29 within this value range, signal crosstalk and parasitic capacitance between the data line 22 and the gate line 21 can be reduced.

In some alternative embodiments, a buffer layer (BF) 28, such as being made of silicon nitride (SiNx) or silicon dioxide ($SiO2$), may also be provided on a side of the substrate 27 close to the data line 22 (including the source electrode).

In some alternative embodiments, the passivation layer 34 includes a first passivation layer 34 and a second passivation layer 34 disposed in sequence in a direction away from the substrate 27. The first passivation portion includes silicon dioxide ($SiO2$), and the second passivation portion includes silicon nitride (SiNx) or silicon oxynitride (SiNO). In this way, the blocking ability can be improved, the channel can be protected, and the device stability can be improved.

In summary, the pixel unit structure according to an embodiment of the present invention can increase the aperture ratio of the pixel opening region defined by the intersection of the gate line 21 and the data line 22 without using the light shielding strip. Furthermore, by making the semiconductor portion of the metal oxide semiconductor layer cover the portion of the gate insulating layer covering the gate electrode (i.e., the protrusion described above), the semiconductor portion faces not only the top surface of the gate electrode, but also both side surfaces of the gate electrode, i.e. a side channel is added on the basis of forming the lateral channel, so that the channel length can be increased under the same spatial size, and thus the stability of the thin film transistor can be improved.

As another technical scheme, an embodiment of the present invention further provides a display panel, which includes the pixel unit structure according to an embodiment of the present invention.

Optionally, the display panel can be applied to a variety of display devices, in particular devices requiring high resolution or devices requiring an increase in pixel aperture ratio under the same display resolution. For example, VR devices. Optionally, the display panel is an LCD display panel.

According to the display panel according to the embodiment of the present invention, by adopting the pixel unit structure according to an embodiment of the present invention, not only the aperture ratio of the pixel opening region defined by the intersection of the gate line 21 and the data line 22 can be increased, but the channel length can be increased under the same spatial size, thereby improving the stability of the thin film transistor.

Figure 7A:
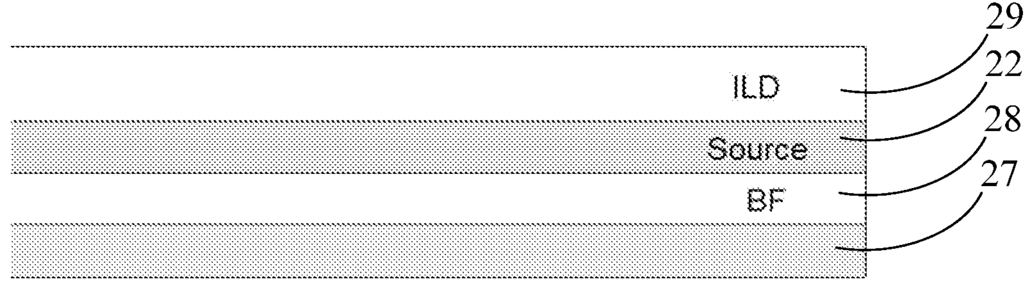
FIG. 7A is a sectional view of Step S1 of a method for preparing a pixel unit structure according to an embodiment of the present invention.
Figure 7B:
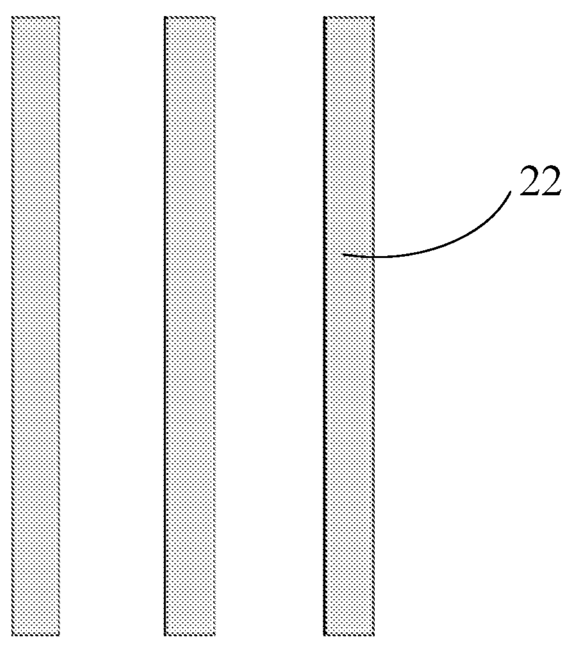
FIG. 7B is a plan view of Step S1 of a method for preparing a pixel unit structure according to an embodiment of the present invention.

As another technical scheme, an embodiment of the present invention further provides a method for preparing a pixel unit structure, including:

S1, referring to FIG. 7A and FIG. 7B together, the data line 22 and the source electrode are formed on the substrate 27; the source electrode is connected to the data line 22;

Optionally, the source electrode is a portion of the data line 22 (i.e. a portion overlapping the second conductive portion 233 of the metal oxide semiconductor layer 23).

Specifically, an entire film layer of the data line 22 (including the source electrode) may be formed on the substrate 27, and then a pattern of the data line 22 may be formed by a patterning process.

In some alternative embodiments, a buffer layer 28 may also be formed on the substrate 27 prior to Step S1, the material of which includes, for example, silicon nitride (SiNx) or silicon dioxide ($SiO2$).

Figure 8A:
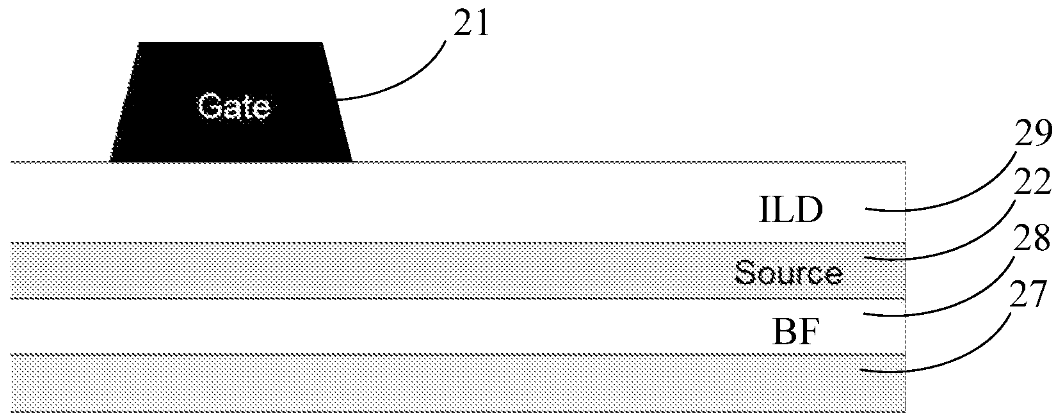
FIG. 8A is a sectional view of Steps S2-S3 of a method for preparing a pixel unit structure according to an embodiment of the present invention.

S2, referring to FIG. 8A, an interlayer dielectric layer 29 is formed on a substrate 27 on which the source electrode is formed.

Figure 8B:
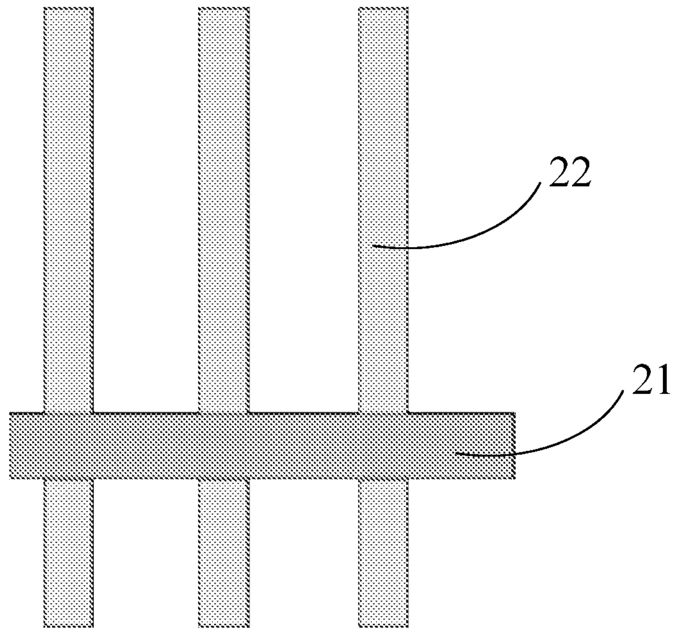
FIG. 8B is a plan view of Step S2-S3 of a method for preparing a pixel unit structure according to an embodiment of the present invention.

S3, referring to FIG. 8A and FIG. 8B, a gate line 21 and a gate electrode are formed on a substrate 27 on which an interlayer dielectric layer 29 is formed; the gate electrode is connected to the gate line 21.

Optionally, the gate electrode is a portion of the gate line 21 (i.e. a portion overlapping the semiconductor portion 231 of the metal oxide semiconductor layer 23).

Specifically, an entire film layer of the gate line 21 (including the gate electrode) may be formed on the substrate 27, and then a pattern of the gate line 21 may be formed by a patterning process.

Figure 9A:
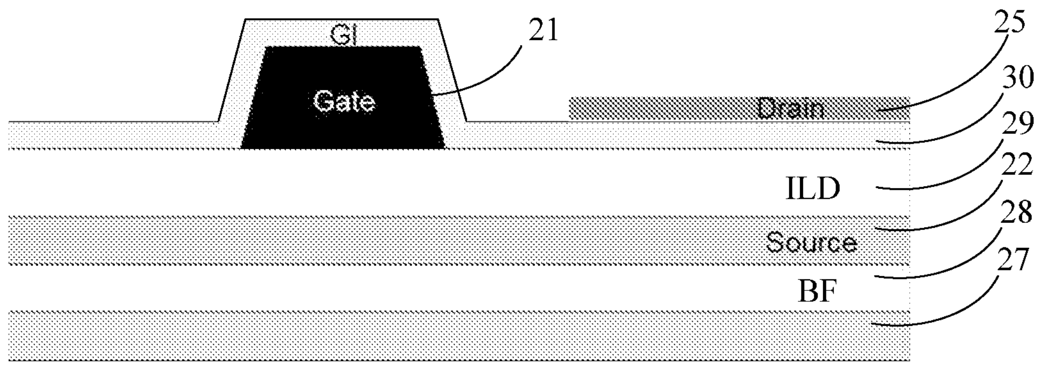
FIG. 9A is a sectional view of Steps S4-S5 of a method for preparing a pixel unit structure according to an embodiment of the present invention.

S4, referring to FIG. 9A, a gate insulating layer 30 is formed on a substrate 27 on which a gate electrode is formed.

Figure 9B:
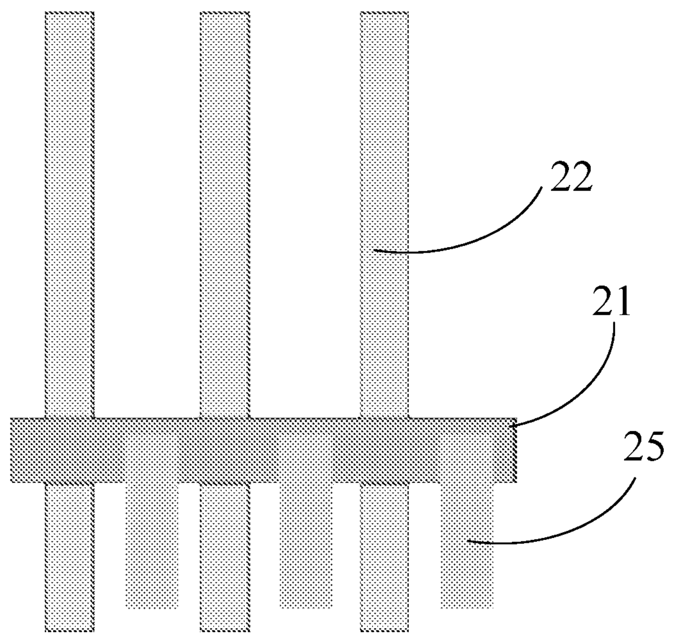
FIG. 9B is a plan view of Steps S4-S5 of a method for preparing a pixel unit structure according to an embodiment of the present invention.

S5, referring to FIG. 9A and FIG. 9B, a drain electrode 25 is formed on a substrate 27 on which the gate insulating layer 30 is formed.

Specifically, an entire film layer of the drain electrode 25 may be formed on the substrate 27, and then a pattern of the drain electrode 25 may be formed by a patterning process.

Optionally, referring to FIG. 9B, a terminal of the drain electrode 25 extends above the gate line 21 (that is, an orthographic projection on the plane parallel to the substrate 27 overlaps an orthographic projection of the gate electrode on the plane parallel to the substrate 27), so that a second via 31 for connecting the pixel electrode 26 and the drain electrode 25 can be disposed above the gate line 21 in a subsequent step.

Figure 10A:
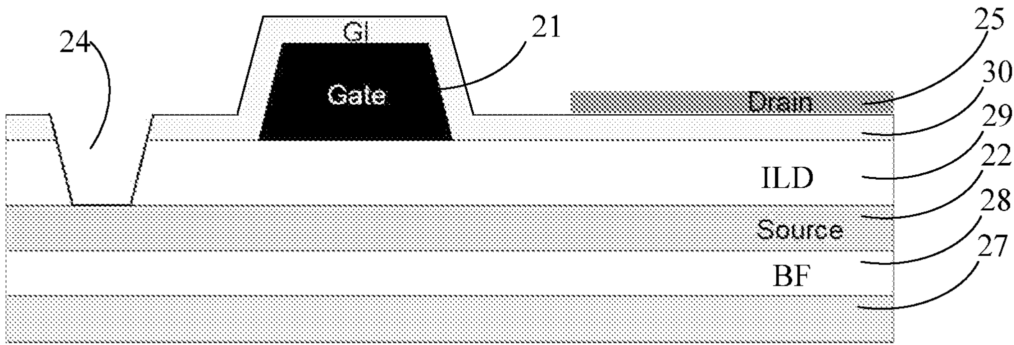
FIG. 10A is a sectional view of Step S6 of a method for preparing a pixel unit structure according to an embodiment of the present invention.
Figure 10B:
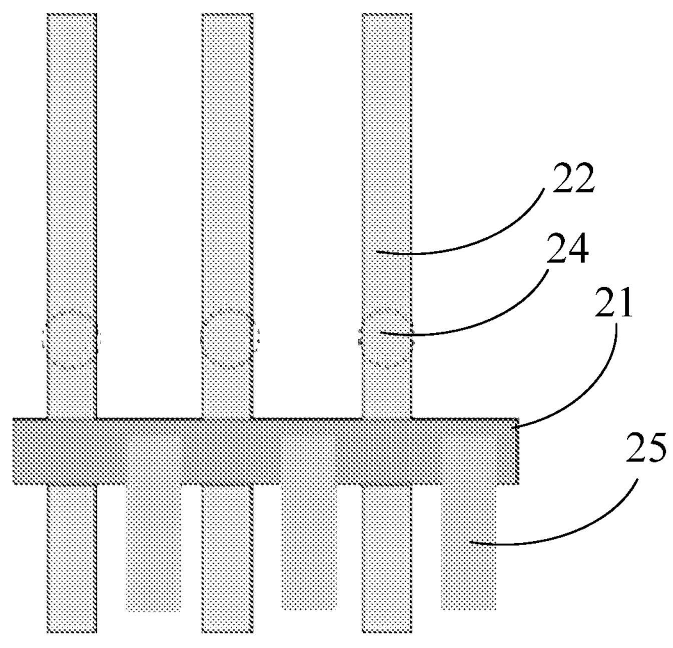
FIG. 10B is a plan view of Step S6 of a method for preparing a pixel unit structure according to an embodiment of the present invention.

S6, referring to FIG. 10A and FIG. 10B, a first via 24 is formed on the gate insulating layer 30 and the interlayer dielectric layer 29.

Optionally, Step S5 can be carried out first, and then Step S6 can be carried out; alternatively, Step S6 may be performed first, and then Step S5 may be performed.

S7, a metal oxide semiconductor layer is formed on a substrate 27 on which the drain electrode 25 is formed; the metal oxide semiconductor layer is disposed on a side of the gate insulating layer 30 away from the substrate 27, and includes a semiconductor portion and a first conductive portion 232 and a second conductive portion respectively located on both sides of the semiconductor portion, wherein the semiconductor portion covers a protrusion of the gate insulating layer 30, and the protrusion is a portion where the gate insulating layer 30 covers the gate electrode; a terminal of the first conductive portion 232 adjacent to the drain electrode 25 is connected to the drain electrode 25 or serves as at least a portion of the drain electrode 25; and the second conductive portion is connected to the source electrode through the first via.

Figure 11A:
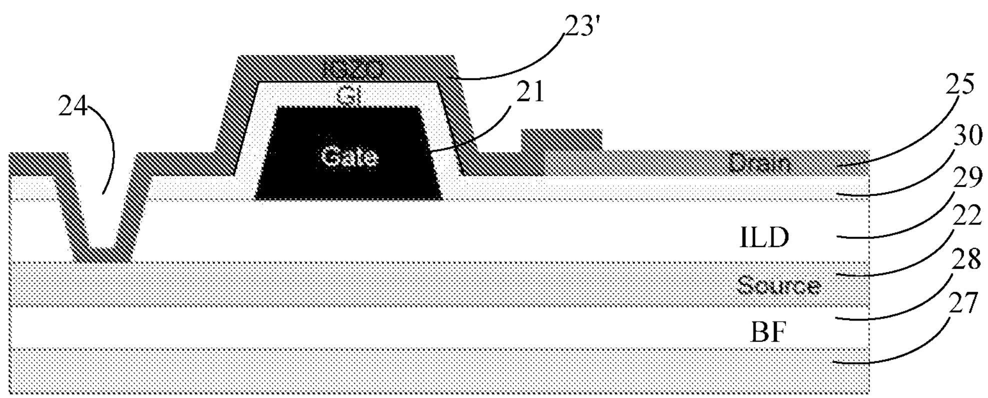
FIG. 11A is a sectional view of Step S7 of a method for preparing a pixel unit structure according to an embodiment of the present invention before a doping process.
Figure 11B:
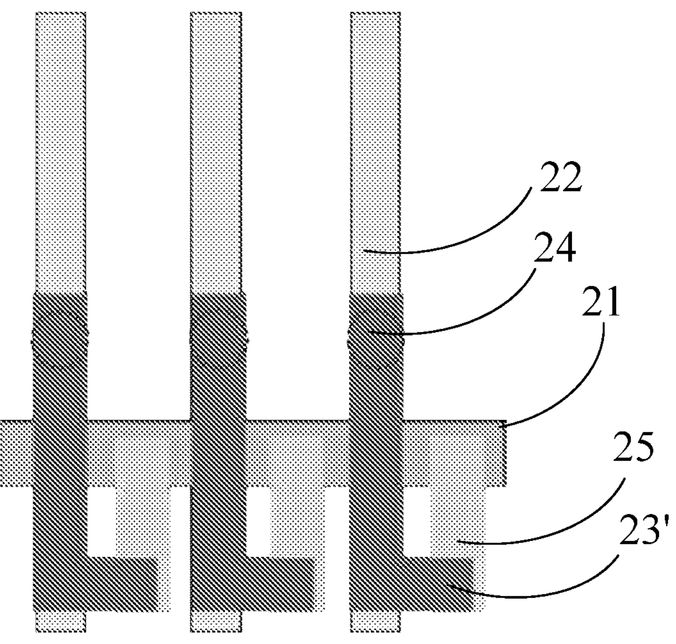
FIG. 11B is a plan view of Step S7 of a method for preparing a pixel unit structure according to an embodiment of the present invention before a doping process.
Figure 12:
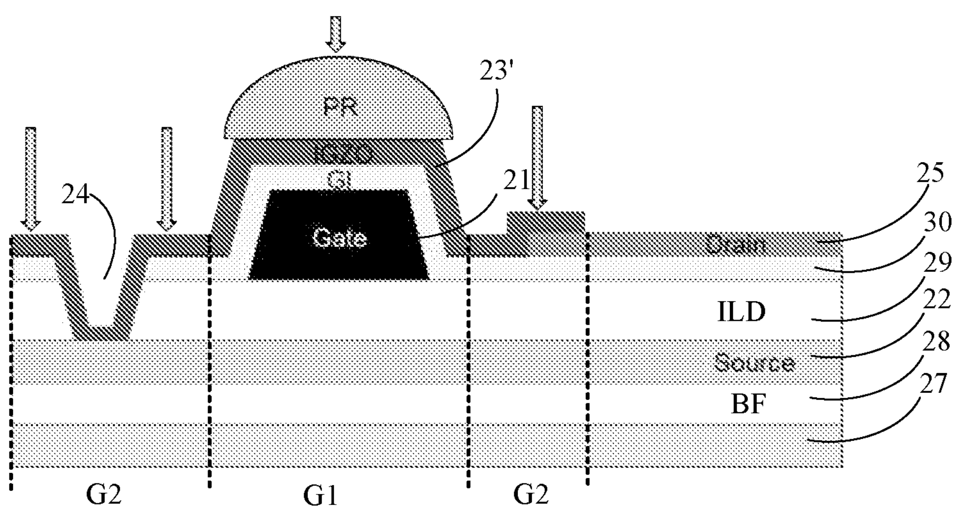
FIG. 12 is a process diagram of a doping process in Step S7.
Figure 13A:
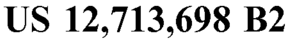
FIG. 13A is a sectional view of Step S7 of a method for preparing a pixel unit structure according to an embodiment of the present invention after a doping process.
Figure 13A:
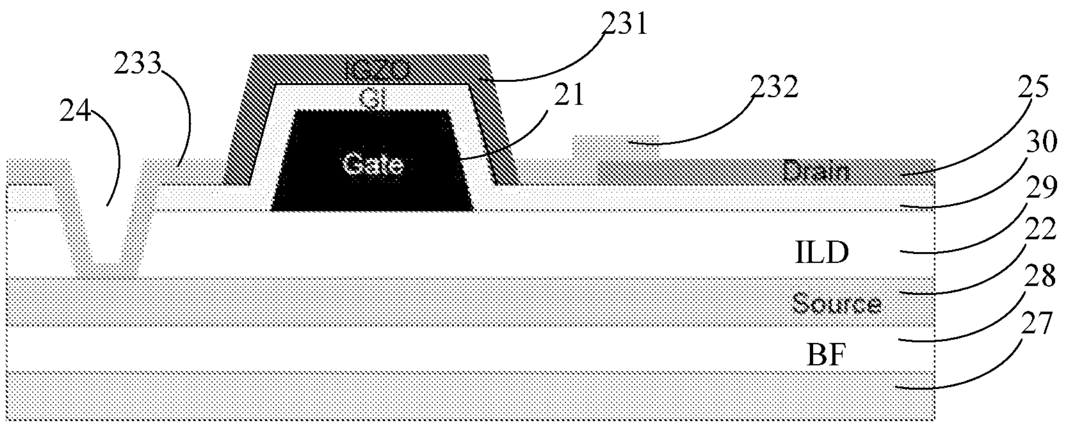
Figure 13B:
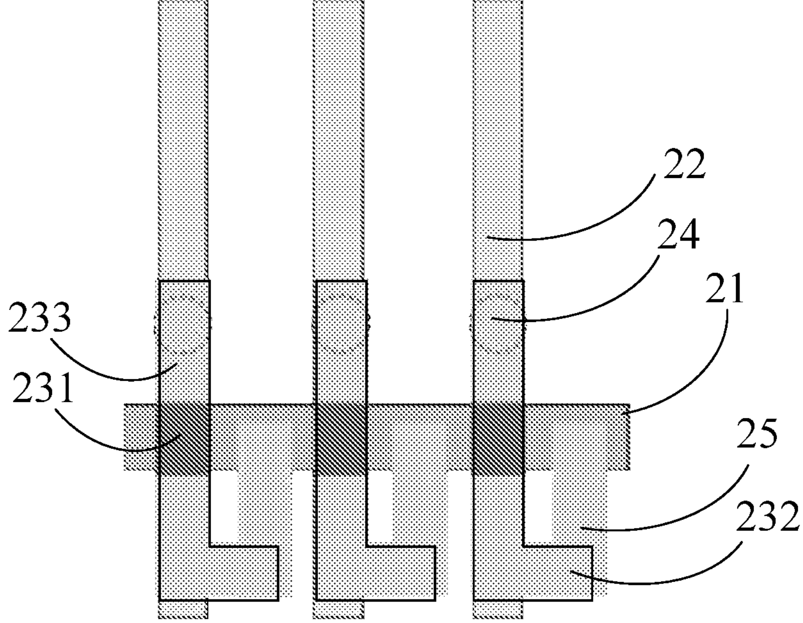
FIG. 13B is a plan view of Step S7 of a method for preparing a pixel unit structure according to the embodiment of the present invention after a doping process.

In the above Step S7, referring to FIGS. 11A and 11B together, it is possible to form an entire film layer of the metal oxide semiconductor layer on the substrate 27, and then to form a pattern of an unconductive metal oxide semiconductor layer 23' by a patterning process. Thereafter, referring to FIG. 12, the channel region G1 of the semiconductor portion 231 corresponding to the unconductive metal oxide semiconductor layer 23' is shielded by a patterned photoresist layer (PR), only the non-channel region G2 corresponding to the first conductive portion 232 and the second conductive portion 233 is exposed, and then the conduction is performed on the non-channel region G2 of the unconductive metal oxide semiconductor layer 23' using a doping process, referring to FIG. 13A and FIG. 13B, finally forming the semiconductor portion 231 and the first conductive portion 232 and the second conductive portion 233.

Figure 14A:
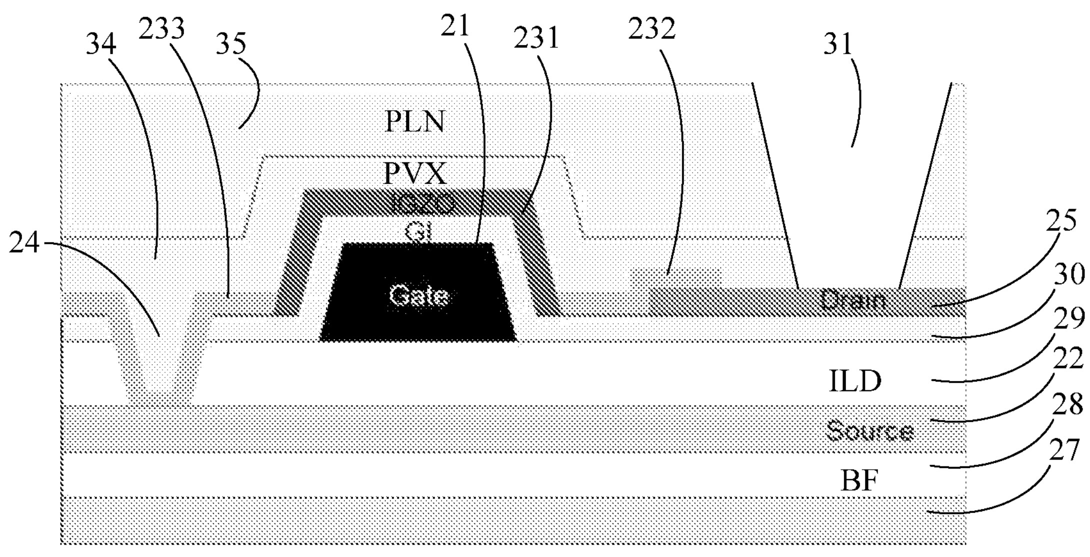
FIG. 14A is a sectional view of Steps S8-S9 of a method for preparing a pixel unit structure according to an embodiment of the present invention.
Figure 14B:
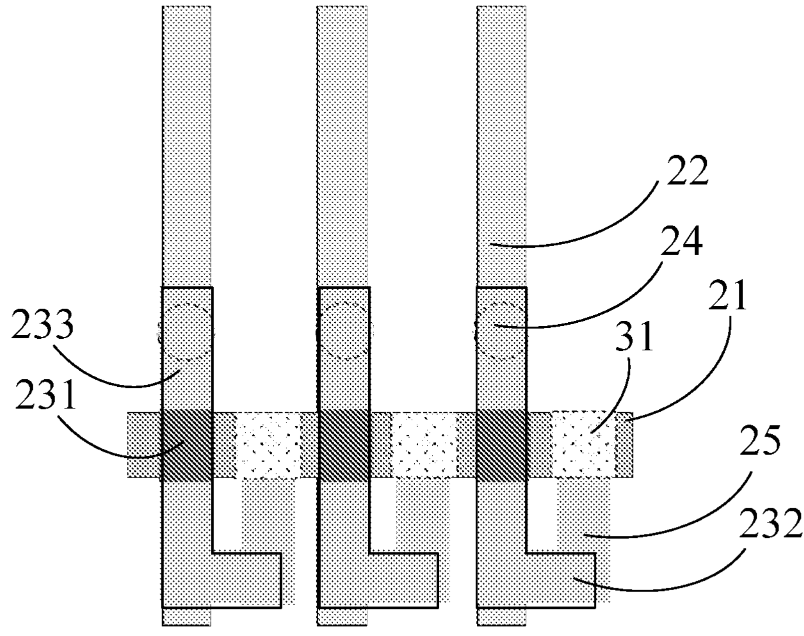
FIG. 14B is a plan view of Steps S8-S9 of a method for preparing a pixel unit structure according to an embodiment of the present invention.

On the basis of adopting the above-mentioned first connection mode, i.e., the first conductive portion 232 is disposed in a same layer as the drain electrode 25, and a terminal of the first conductive portion 232 adjacent to the drain electrode 25 is superposed on a side of the drain electrode 25 away from the substrate 27. In some alternative embodiments, after the above-mentioned Step S7, the method for preparing the pixel unit structure according to an embodiment of the present invention further includes: S8, referring to FIG. 14A and FIG. 14B, a passivation layer 34 is formed on a substrate 27 on which the metal oxide semiconductor layer is formed; the passivation layer 34 is disposed on a side of the interlayer dielectric layer 29 away from the substrate 27 and covers the metal oxide semiconductor layer 23.

S9, a planarization layer 35 is formed on a substrate 27 on which the passivation layer 34 is formed.

S10, a second via 31 is correspondingly formed on the planarization layer 35 and the passivation layer 34.

That is, the patterning process of the planarization layer 35 and the passivation layer 34 is achieved in a same step.

S11, referring to FIG. 3A and FIG. 3B, a pixel electrode 26 is formed on a substrate 27 on which the planarization layer 35 is formed; the pixel electrode 26 is disposed on a side of the planarization layer 35 away from the substrate 27 and is connected to the drain electrode 25 through a second via 31.

Preferably, an orthographic projection of the second via 31 on the plane parallel to the substrate 27 overlaps an orthographic projection of the gate electrode on the plane parallel to the substrate 27. In this way, the gate line 21 (including the gate electrode) can play a shielding role at the bottom of the second via 31 (i.e. a side close to the substrate 27) so that light leakage from the via can be reduced or avoided. Specifically, an orthographic projection of the second via on the plane parallel to the substrate 27 and an orthographic projection of the gate electrode on the plane parallel to the substrate 27 are completely located in an orthographic projection of the gate line 21 (including the gate electrode) on the plane parallel to the substrate 27. In this way, the gate line 21 (including the gate electrode) can play a shielding role at the bottom of the second via 31 (i.e. a side close to the substrate 27) so that light leakage from the via can be reduced or avoided.

On the basis of adopting the above-mentioned second connection mode, in some optional embodiments, after the above-mentioned Step S7, the method for preparing a pixel unit structure according to an embodiment of the present invention further includes:

S8', a passivation layer 34 is formed on a substrate 27 on which the metal oxide semiconductor layer is formed; the passivation layer 34 is disposed on a side of the interlayer dielectric layer 29 away from the substrate 27 and covers the metal oxide semiconductor layer 23.

Figure 15A:
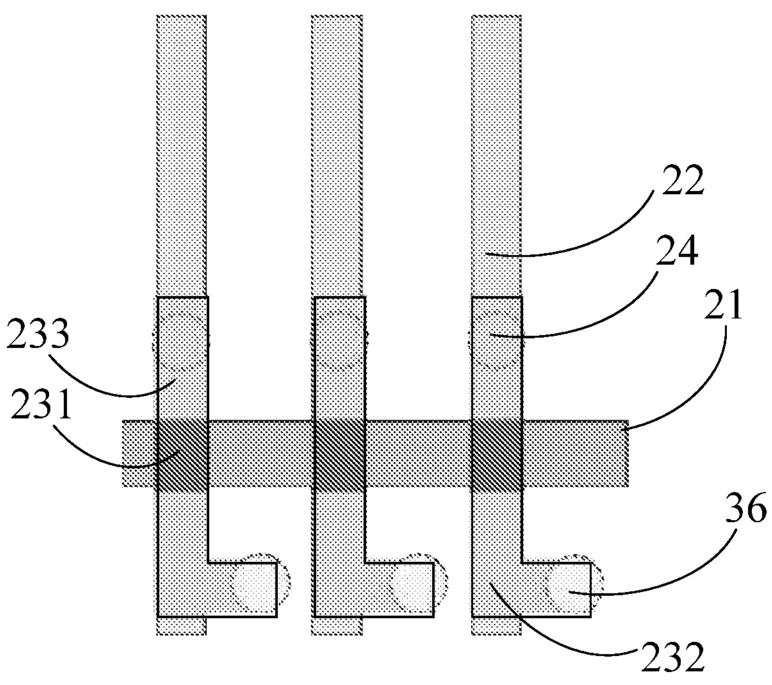
FIG. 15A is a plan view of Step S9' of a method for preparing a pixel unit structure according to an embodiment of the present invention.

S9', referring to FIGS. 5B and 15A together, a third via 36 is formed on the passivation layer 34.

Figure 15B:
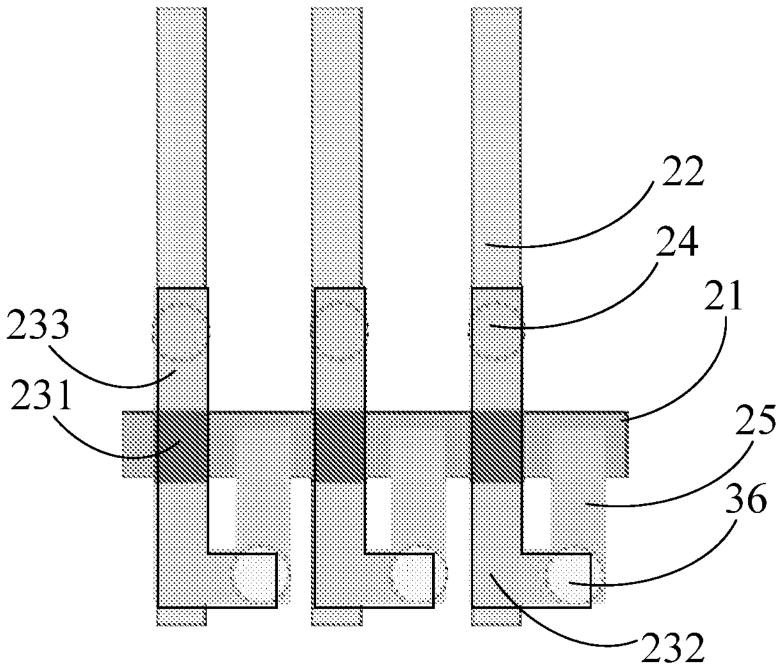
FIG. 15B is a plan view of Step S10' of a method for preparing a pixel unit structure according to an embodiment of the present invention.

S10', referring to FIG. 15B, a drain electrode 25 is formed on a substrate 27 on which the passivation layer 34 is formed. The drain electrode 25 is disposed on a side of the passivation layer 34 away from the substrate 27 and is connected to the first conductive portion 232 through the third via 36.

That is to say, the first conductive portion 232 and the drain electrode 25 are disposed in different layers, and the passivation layer 34 is located between the first conductive portion 232 and the drain electrode 25. This arrangement can effectively reduce the parasitic capacitance between the first conductive portion 232 and the drain electrode 25.

Specifically, the second connection mode is achieved by forming the drain electrode 25 after forming the passivation layer 34 and connecting the drain electrode 25 to the first conductive portion 232 through the third via 36 on the passivation layer 34.

On the basis of adopting the above-mentioned second connection mode, in some optional embodiments, after the above-mentioned Step S10', the method for preparing a pixel unit structure according to an embodiment of the present invention further includes:

S11', a planarization layer 35 is formed on a substrate 27 on which the drain electrode 25 is formed; the planarization layer 35 is disposed on a side of the passivation layer 34 away from the substrate 27.

S12', a second via 31 is formed on the planarization layer 35.

S13', a pixel electrode 26 is formed on a substrate 27 on which the planarization layer 35 is formed; the pixel electrode 26 is disposed on a side of the planarization layer 35 away from the substrate 27 and is connected to the drain electrode 25 through a second via 31.

Preferably, an orthographic projection of the second via 31 on the plane parallel to the substrate 27 overlaps an orthographic projection of the gate electrode on the plane parallel to the substrate 27. In this way, the gate line 21 (including the gate electrode) can play a shielding role at the bottom of the second via 31 (i.e. a side close to the substrate 27) so that light leakage from the via can be reduced or avoided. Specifically, an orthographic projection of the second via on the plane parallel to the substrate 27 and an orthographic projection of the gate electrode on the plane parallel to the substrate 27 are completely located in an orthographic projection of the gate line 21 (including the gate electrode) on the plane parallel to the substrate 27. In this way, the gate line 21 (including the gate electrode) can play a shielding role at the bottom of the second via 31 (i.e. a side close to the substrate 27) so that light leakage from the via can be reduced or avoided.

Figure 16:
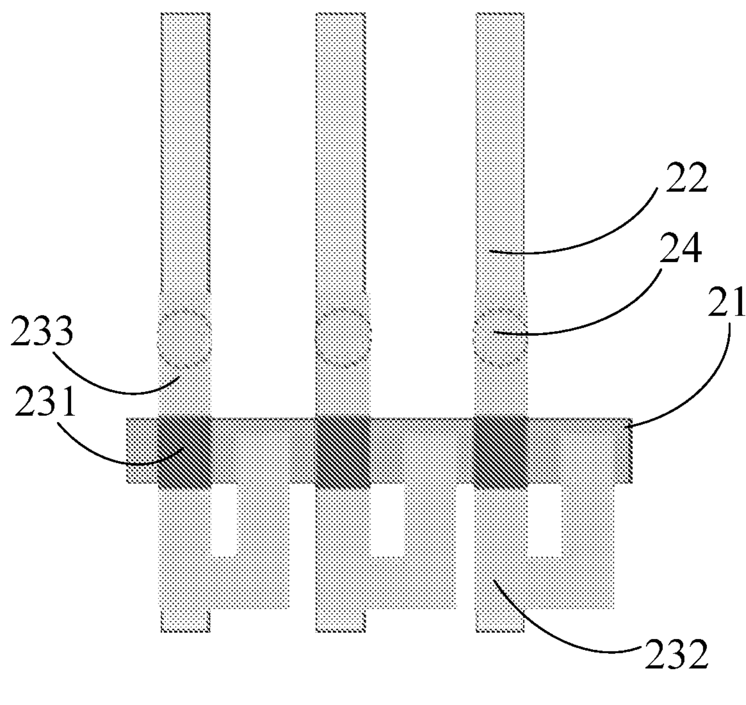
FIG. 16 is a plan view of a method for preparing a pixel unit structure according to an embodiment of the present invention before Step S8".

On the basis of adopting a third connection mode, i.e., referring to FIG. 16, a terminal of the first conductive portion 232 adjacent to the drain electrode 25 serves as at least a portion of the drain electrode 25. In this way, a patterning process (i.e., Mask) can be reduced, so that not only the process can be simplified and the process efficiency can be improved, but also the pixel unit structure can be simplified and the product cost can be reduced. In some optional embodiments, after the above-mentioned Step S7, the method for preparing a pixel unit structure according to an embodiment of the present invention further includes:

S8", a passivation layer 34 is formed on a substrate 27 on which the metal oxide semiconductor layer is formed; the passivation layer 34 is disposed on a side of the interlayer dielectric layer 29 away from the substrate 27 and covers the metal oxide semiconductor layer 23.

S9", a planarization layer 35 is formed on a substrate 27 on which the passivation layer 34 is formed.

S10", a second via 31 is correspondingly formed on the planarization layer 35 and the passivation layer 34.

S11", a pixel electrode 26 is formed on a substrate 27 on which the planarization layer 35 is formed; the pixel electrode 26 is disposed on a side of the planarization layer 35 away from the substrate 27 and is connected to the drain electrode 25 through a second via 31.

Preferably, an orthographic projection of the second via 31 on the plane parallel to the substrate 27 overlaps an orthographic projection of the gate electrode on the plane parallel to the substrate 27. In this way, the gate line 21 (including the gate electrode) can play a shielding role at the bottom of the second via 31 (i.e. a side close to the substrate 27) so that light leakage from the via can be reduced or avoided. Specifically, an orthographic projection of the second via on the plane parallel to the substrate 27 and an orthographic projection of the gate electrode on the plane parallel to the substrate 27 are completely located in an orthographic projection of the gate line 21 (including the gate electrode) on the plane parallel to the substrate 27. In this way, the gate line 21 (including the gate electrode) can play a shielding role at the bottom of the second via 31 (i.e. a side close to the substrate 27) so that light leakage from the via can be reduced or avoided.

As another technical scheme, an embodiment of the present invention further provides a method for preparing the display panel, which includes the method for preparing a pixel unit structure according to an embodiment of the present invention.

In summary, the embodiment of the present invention can increase the aperture ratio of the pixel opening region defined by the intersection of the gate line 21 and the data line 22 without using the light shielding strip. Furthermore, by making the semiconductor portion of the metal oxide semiconductor layer cover the portion of the gate insulating layer covering the gate electrode (i.e., the protrusion described above), the semiconductor portion faces not only the top surface of the gate electrode, but also both side surfaces of the gate electrode, i.e. a side channel is added on the basis of forming the lateral channel, so that the channel length can be increased under the same spatial size, and thus the stability of the thin film transistor can be improved.

It is to be understood that the above embodiments are only exemplary embodiments employed for the purpose of illustrating the principles of the present invention, however the present invention is not limited thereto. To those of ordinary skill in the art, various modifications and improvements may be made without departing from the spirit and substance of the present disclosure, and these modifications and improvements are also considered to be within the scope of the present disclosure.

The invention claimed is:

1. A pixel unit structure comprising a gate line, a data line and a thin film transistor, wherein the gate line and the data line intersect and define a pixel region; wherein the thin film transistor comprises a source electrode, an interlayer dielectric layer, a gate electrode, a gate insulating layer, a drain electrode and a metal oxide semiconductor layer formed on a substrate, wherein the source electrode, the interlayer dielectric layer, the gate electrode and the gate insulating layer are sequentially disposed in a direction away from the substrate; the source electrode is connected to the data line; the gate electrode is connected to the gate line; the drain electrode is disposed on a side of the gate insulating layer away from the substrate;

the metal oxide semiconductor layer is disposed on a side of the gate insulating layer away from the substrate, and comprises a semiconductor portion and a first conductive portion and a second conductive portion respectively located on both sides of the semiconductor portion, wherein the semiconductor portion covers a protrusion of the gate insulating layer, and the protrusion is a portion where the gate insulating layer covers the gate electrode; a terminal of the first conductive portion adjacent to the drain electrode is connected to the drain electrode or serves as at least a portion of the drain electrode; and the second conductive portion is connected to the source electrode through a first via formed correspondingly on the gate insulating layer and the interlayer dielectric layer, wherein the gate electrode comprises a first outer surface adjacent to the interlayer dielectric layer and a second outer surface adjacent to the gate insulating layer; and a cross section length of the second outer surface in a direction perpendicular to an extension direction of the gate electrode satisfies that an equivalent channel length is greater than or equal to a preset length.

2. The pixel unit structure according to claim 1, wherein the equivalent channel length is greater than or equal to 3 microns.

3. The pixel unit structure according to claim 1, wherein a shape of the second outer surface in a cross section in the direction perpendicular to the extension direction of the gate electrode comprises a polygon or a circular arc.

4. The pixel unit structure according to claim 1, wherein a cross section shape of the gate electrode perpendicular to the extension direction of the gate electrode comprises an isosceles trapezoid;

the equivalent channel length satisfies a following relationship:

$$L = c + 2\times\left(\frac{a}{\sin\theta}\right)$$

wherein L is the equivalent channel length; a is a length of a waist of the isosceles trapezoid; b is a length of a long side of the isosceles trapezoid; c is a length of a short side of the isosceles trapezoid; θ is a bottom angle of the isosceles trapezoid, and $$\tan\theta = \frac{a}{\left(\frac{b}{2} - \frac{c}{2}\right)}.$$

5. The pixel unit structure according to claim 1, wherein the interlayer dielectric layer comprises silicon dioxide; and a thickness of the interlayer dielectric layer is greater than or equal to 5000 Å.

6. A display panel comprising the pixel unit structure according to claim 1.

7. The pixel unit structure according to claim 1, wherein the first conductive portion is disposed in a same layer as the drain electrode, and a terminal of the first conductive portion adjacent to the drain electrode is superposed on a side of the drain electrode away from the substrate.

8. The pixel unit structure according to claim 7, wherein the thin film transistor further comprises a passivation layer, a planarization layer and a pixel electrode, wherein the passivation layer is disposed on a side of the interlayer dielectric layer away from the substrate and covers the metal oxide semiconductor layer; the planarization layer is disposed on a side of the passivation layer away from the substrate; the pixel electrode is disposed on a side of the planarization layer away from the substrate, and is connected to the drain electrode through a second via correspondingly formed on the planarization layer and the passivation layer.

9. The pixel unit structure according to claim 1, wherein the thin film transistor further comprises a passivation layer disposed on a side of the interlayer dielectric layer away from the substrate and covering the metal oxide semiconductor layer;

the drain electrode is disposed on a side of the passivation layer away from the substrate, and is connected to the first conductive portion through a third via formed on the passivation layer.

10. The pixel unit structure according to claim 9, wherein the thin film transistor further comprises a planarization layer and a pixel electrode, wherein the planarization layer is disposed on a side of the passivation layer away from the substrate; the pixel electrode is disposed on a side of the planarization layer away from the substrate, and is connected to the drain electrode through a second via formed on the planarization layer.

11. The pixel unit structure according to claim 1, wherein a terminal of the first conductive portion adjacent to the drain electrode serves as at least a portion of the drain electrode;

the thin film transistor further comprises a passivation layer, a planarization layer and a pixel electrode, wherein the passivation layer is disposed on a side of the interlayer dielectric layer away from the substrate and covers the metal oxide semiconductor layer; the planarization layer is disposed on a side of the passivation layer away from the substrate; the pixel electrode is disposed on a side of the planarization layer away from the substrate, and is connected to the first conductive portion through a second via correspondingly formed on the planarization layer and the passivation layer.

12. The pixel unit structure according to claim 11, wherein an orthographic projection of the second via on a plane parallel to the substrate overlaps an orthographic projection of the gate on a plane parallel to the substrate.

13. The pixel unit structure according to claim 11, wherein the passivation layer comprises a first passivation layer and a second passivation layer disposed in sequence in a direction away from the substrate, and the first passivation portion comprises silicon dioxide; and the second passivation portion comprises silicon nitride or silicon oxynitride.

14. A method for preparing a pixel unit structure, comprising:

forming a data line and a source electrode on a substrate, wherein the source electrode is connected to the data line;

forming an interlayer dielectric layer on the substrate on which the source electrode is formed;

forming a gate line and a gate electrode on the substrate on which the interlayer dielectric layer is formed, wherein the gate electrode is connected to the gate line;

forming a gate insulating layer on the substrate on which the gate electrode is formed;

forming a drain electrode on the substrate on which the gate insulating layer is formed;

correspondingly forming a first via on the gate insulating layer and the interlayer dielectric layer;

forming a metal oxide semiconductor layer on the substrate on which the drain electrode is formed; wherein the metal oxide semiconductor layer is disposed on a side of the gate insulating layer away from the substrate, and comprises a semiconductor portion and a first conductive portion and a second conductive portion respectively located on both sides of the semiconductor portion, wherein the semiconductor portion covers a protrusion of the gate insulating layer, and the protrusion is a portion where the gate insulating layer covers the gate electrode; a terminal of the first conductive portion adjacent to the drain electrode is connected to the drain electrode or serves as at least a portion of the drain electrode; and the second conductive portion is connected to the source electrode through the first via.

15. The method for preparing a pixel unit structure according to claim 14, wherein a terminal of the first conductive portion adjacent to the drain electrode serves as at least a portion of the drain electrode;

after the metal oxide semiconductor layer is formed on the substrate on which the drain electrode is formed, the method further comprises:

forming a passivation layer on the substrate on which the metal oxide semiconductor layer is formed; wherein the passivation layer is disposed on a side of the interlayer dielectric layer away from the substrate and covers the metal oxide semiconductor layer;

forming a planarization layer on the substrate on which the passivation layer is formed;

correspondingly forming a second via on the planarization layer and the passivation layer;

forming a pixel electrode on the substrate on which the planarization layer is formed; wherein the pixel electrode is disposed on a side of the planarization layer away from the substrate, and is connected to the drain electrode through the second via.

16. The method for preparing a pixel unit structure according to claim 14, wherein the first conductive portion is disposed in a same layer as the drain electrode, and a terminal of the first conductive portion adjacent to the drain electrode is superposed on a side of the drain electrode away from the substrate;

after the metal oxide semiconductor layer is formed on the substrate on which the drain electrode is formed, the method further comprises:

forming a passivation layer on the substrate on which the metal oxide semiconductor layer is formed; wherein the passivation layer is disposed on a side of the interlayer dielectric layer away from the substrate and covers the metal oxide semiconductor layer;

forming a planarization layer on the substrate on which the passivation layer is formed;

correspondingly forming a second via on the planarization layer and the passivation layer;

forming a pixel electrode on the substrate on which the planarization layer is formed; wherein the pixel electrode is disposed on a side of the planarization layer away from the substrate, and is connected to the drain electrode through the second via.

17. The method for preparing a pixel unit structure according to claim 16, wherein an orthographic projection of the second via on a plane parallel to the substrate overlaps an orthographic projection of the gate electrode on a plane parallel to the substrate.

18. The method for preparing a pixel unit structure according to claim 14, wherein after the metal oxide semiconductor layer is formed on the substrate on which the drain electrode is formed, the method further comprises:

forming a passivation layer on the substrate on which the metal oxide semiconductor layer is formed; wherein the passivation layer is disposed on a side of the interlayer dielectric layer away from the substrate and covers the metal oxide semiconductor layer;

forming a third via on the passivation layer;

forming a drain electrode on the substrate on which the passivation layer is formed, wherein the drain electrode is disposed on a side of the passivation layer away from the substrate and is connected to the first conductive portion through the third via.

19. The method for preparing a pixel unit structure according to claim 18, wherein after the drain electrode is formed on the substrate on which the passivation layer is formed, the method further comprises:

forming a planarization layer on the substrate on which the drain electrode is formed; wherein the planarization layer is disposed on a side of the passivation layer away from the substrate;

forming a second via on the planarization layer;

forming a pixel electrode on the substrate on which the planarization layer is formed; wherein the pixel electrode is disposed on a side of the planarization layer away from the substrate, and is connected to the drain electrode through the second via.

* * * * *